United States Patent
Kachlic

(10) Patent No.: US 10,804,627 B2
(45) Date of Patent: *Oct. 13, 2020

(54) CONNECTOR SYSTEM WITH THERMAL MANAGEMENT

(71) Applicant: Molex, LLC, Lisle, IL (US)

(72) Inventor: Jerry D. Kachlic, Glen Ellyn, IL (US)

(73) Assignee: Molex, LLC, Lisle, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/215,141

(22) Filed: Dec. 10, 2018

(65) Prior Publication Data

US 2019/0115677 A1    Apr. 18, 2019

Related U.S. Application Data

(63) Continuation of application No. 15/237,780, filed on Aug. 16, 2016, now Pat. No. 10,153,571.

(60) Provisional application No. 62/206,598, filed on Aug. 18, 2015.

(51) Int. Cl.
| | |
|---|---|
| H01R 12/71 | (2011.01) |
| H01R 13/6594 | (2011.01) |
| H01R 24/60 | (2011.01) |
| H05K 7/20 | (2006.01) |
| H01R 12/72 | (2011.01) |
| H01R 13/6587 | (2011.01) |
| G02B 6/42 | (2006.01) |

(52) U.S. Cl.
CPC ........ *H01R 12/712* (2013.01); *H01R 13/6594* (2013.01); *G02B 6/4269* (2013.01); *H01R 12/724* (2013.01); *H01R 13/6587* (2013.01); *H01R 24/60* (2013.01); *H05K 7/20436* (2013.01)

(58) Field of Classification Search
CPC .............. H01R 12/712; H01R 13/2442; H01R 13/6594; H01R 24/60; H05K 7/20127; H05K 7/2049; H05K 7/20436
USPC ......................................................... 439/487
See application file for complete search history.

(56) References Cited

U.S. PATENT DOCUMENTS

| | | |
|---|---|---|
| 7,764,504 B2 | 7/2010 | Phillips et al. |
| 8,823,540 B2 | 9/2014 | Scholeno |
| 9,518,785 B2 | 12/2016 | Szczesny |
| 2003/0161108 A1 | 8/2003 | Bright et al. |
| 2008/0307817 A1 | 12/2008 | Roesner et al. |
| 2012/0058670 A1 | 3/2012 | Regnier et al. |
| 2012/0099275 A1 | 4/2012 | Regnier |
| 2013/0114211 A1 | 5/2013 | Regnier |
| 2013/0164970 A1 | 6/2013 | Regnier et al. |
| 2013/0344745 A1 | 12/2013 | Nichols |
| 2015/0002967 A1 | 1/2015 | Kawase et al. |

(Continued)

FOREIGN PATENT DOCUMENTS

CN     1893037 A    10/2007

*Primary Examiner* — Nguyen Tran
*Assistant Examiner* — Paul D Baillargeon
(74) *Attorney, Agent, or Firm* — Molex, LLC

(57) ABSTRACT

A connector system includes a cage with an intermediate section. The cage support a connector and the resulting connector system includes an upper port and a lower port. A heat sink is provided in the intermediate section that is configured to cool a module inserted into the lower port. Apertures can allow air to flow through the connector system so as to allow for improved cooling by more directly cooling the inserted module. The heat sink can be urged into the lower port by a biasing element.

15 Claims, 8 Drawing Sheets

(56) References Cited

U.S. PATENT DOCUMENTS

2016/0197424 A1 7/2016 L'Esperance et al.
2017/0054234 A1 2/2017 Kachlic

CONNECTOR SYSTEM WITH THERMAL MANAGEMENT

RELATED APPLICATIONS

This is a continuation application of pending U.S. patent application Ser. No. 15/237,780, filed Aug. 16, 2016, which claims priority to U.S. Provisional Application No. 62/206,598, filed Aug. 18, 2015, both of which are incorporated herein by reference in their entirety.

FIELD OF THE INVENTION

This disclosure relates to field of electrical connectors, more specifically to the field of input/output (I/O) connectors configured to manage thermal energy.

DESCRIPTION OF RELATED ART

Input/Output (I/O) connectors are commonly used to provide connectivity between boxes or racks of computers, routers and switches. Commonly used formats of I/O connectors include Small form-factor pluggable (SFP), Quad small form-factor pluggable (QSFP), miniSAS, miniSAS HD and PCIe 8× connectors. These connectors include plugs and receptacles that are defined by standard bodies and intended to provide reliable performance regardless of the vendor.

Typical I/O connector systems include a cable assembly and a board mounted connector. The cable assembly, which commonly includes a pair of plug connectors on opposite ends of a cable, is configured to transmit signals over a desired distance. The board mounted connector is typically a receptacle positioned in a panel with the receptacle configured to receive and mate with the plug connector.

As data rates have increased, one issue that has been difficult to overcome is the physical limitation of medium that is used to transmit signals from between the plug connectors. Passive cables, for example, are cost effective for shorter distances but tend to be limited with respect to distance as signal frequencies increase. Active copper and fiber optic cables are well suited to transmit signals over longer distances but require power and thus tend to create thermal issues if the connector system is not properly designed. One of the major issues with the increased use of active cables assemblies is the increased thermal burden the use of such assemblies place on the system. Attempting to cool a module that is placed inside a guide frame or cage is relatively challenging, especially in situations where there are a large number of ports arranged adjacently (e.g., the front panel density is high). Thus, certain individuals would appreciate an improvement to thermal management in the receptacle system used in I/O connectors.

BRIEF SUMMARY

A receptacle connector includes cage consisting of an upper port and a lower port, each port configured to receive a module. The ports are arranged in a stacked relationship and a board mounted connector is positioned in the cage and adapted to mate with the modules. An intermediate space is defined between the ports and includes a heat sink disposed in the intermediate space. The heat sink includes a flat portion that extends into the lower port and is configured to slidably engage, in operation, a module when the module is inserted into the port. A biasing element is used to urge the heat sink to toward the module so as to maintain continuous pressure between the heat sink and the module. Fins are formed on the heat sink to increase surface area exposure. In operation, thermal energy from a module is transferred from the module to heat sink and the thermal energy is in turn transferred from the heat sink to fins. The cage of connector system is configured with apertures so that air flows thorough the cage and across the heat sink fins, thus allowing the removal of thermal energy from the connector system. Thus the depicted connector system is suitable for use in an architecture such as a rack system that typically directs air from one side of the rack to the other side of the rack.

BRIEF DESCRIPTION OF THE DRAWINGS

The present invention is illustrated by way of example and not limited in the accompanying figures in which like reference numerals indicate similar elements and in which.

DETAILED DESCRIPTION

FIGS. 1-11 illustrate features that can be used to provide a connector with desired cooling and it is to be understood that the disclosed embodiments are merely exemplary, and may be embodied in various forms. Specific details disclosed herein are not to be interpreted as limiting, but merely as a basis for the claims and as a representative basis for teaching and enabling one skilled in the art. Therefore, unless otherwise noted, features disclosed herein may be combined together to form additional combinations that were not otherwise shown for purposes of brevity.

Various configurations have been used to manage thermal energy in I/O connectors especially in rack type mounting systems. Typically, the rack includes a cage configured with an upper port and a lower port. In these arrangements the upper port is somewhat exposed to the exterior of the rack whereas the lower port is positioned with no external visibility. In these arrangements, a heat sink can be readily adapted to engage a module positioned in the upper port but not to one positioned in the lower port. In these instances, other thermal management structures have been employed, such as directed air flow and other thermal transfer methods such as thermally conductive spring fingers adapted to engage the module and channel the thermal energy to an exterior positioned heat sink. These methods can be costly and use valuable space limiting options for adjacently positioned I/O connectors especially in high density architecture.

Figure 1:
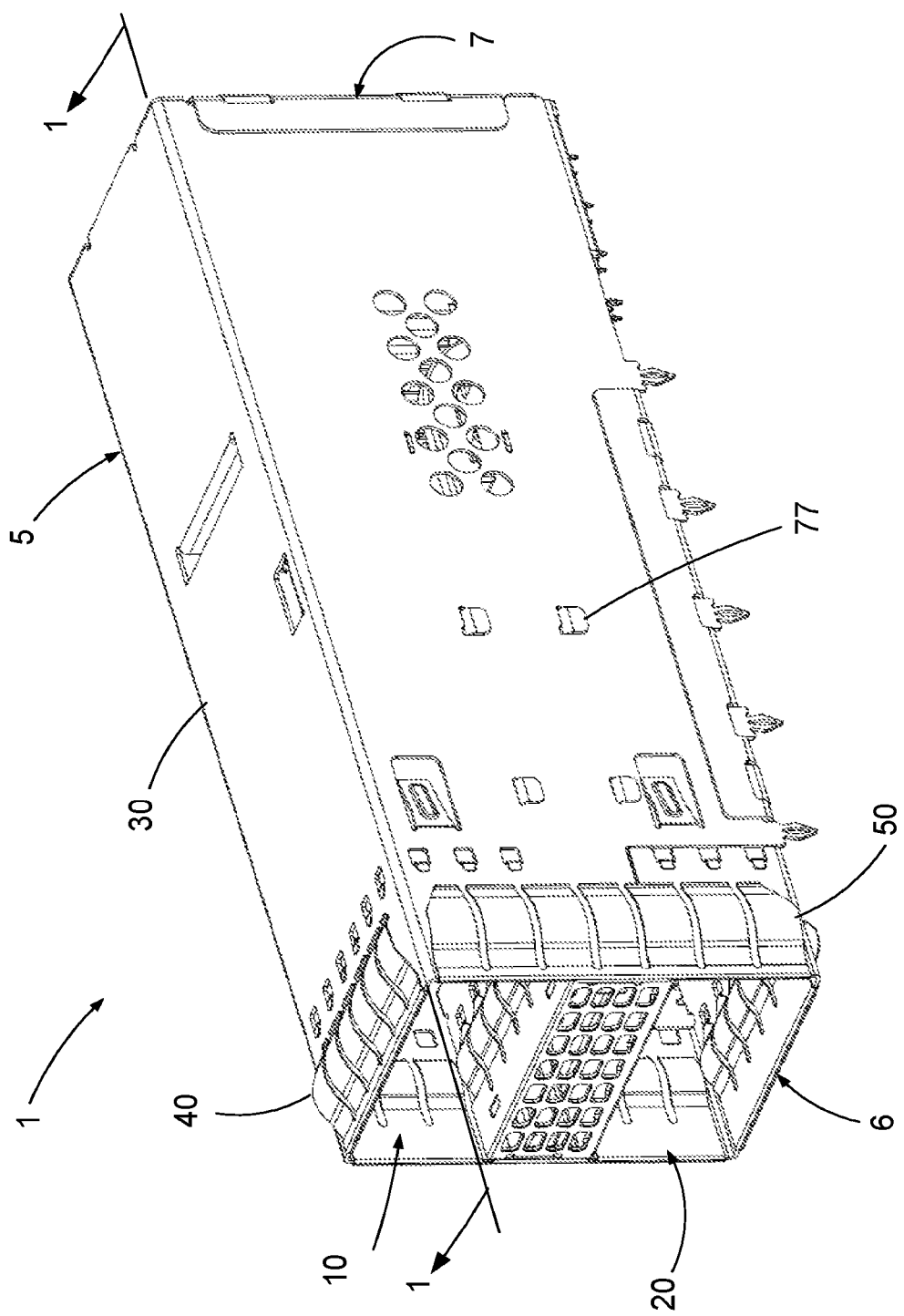
FIG. 1 illustrates a perspective view of an embodiment of a connector system.
Figure 2:
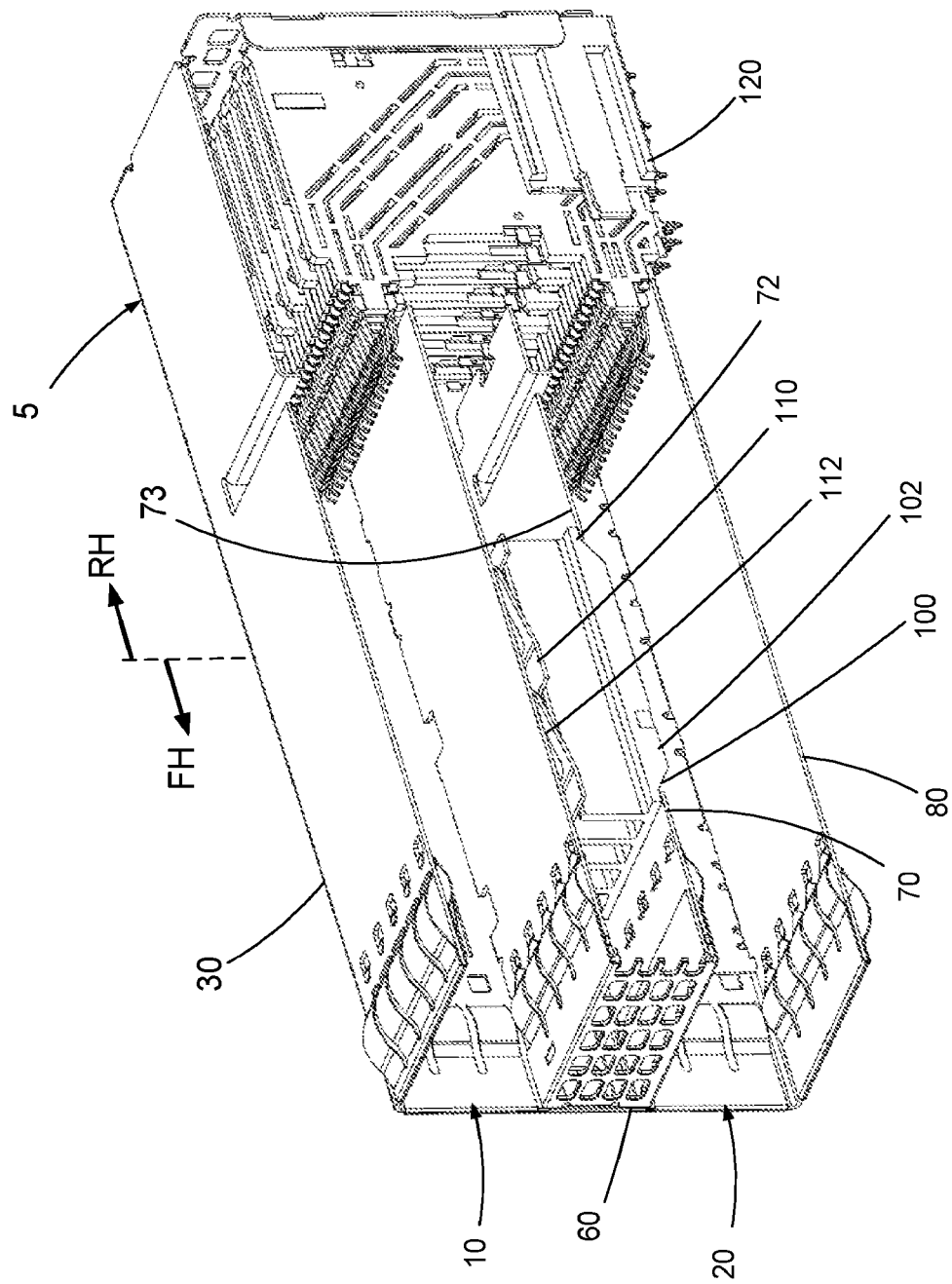
FIG. 2 illustrates a perspective view of a sectional view taken along line 1-1 in FIG. 1.

A connector system 1 includes a cage assembly 5 that defines a front face 6 and a rear face 7 and includes a connector 120 that can be positioned on a substrate 2 (which may be a standard circuit board or other desirable configuration) and includes an upper port 10 and a lower port 20 that are each configured to receive mating plug modules. As illustrated in FIGS. 1 and 2, the connector system 1 includes a stacked connector 120 having a plurality of laterally spaced wafers that provide rows of cantilevered contacts 125 (which are typically positioned in a card slot) and at least one row of cantilevered contacts 125 is positioned in each port. In a preferred embodiment the connector 120 will be adjacent the rear face and spaced apart from the front face such that, if the cage assembly was divided into a front half FH (on the front face side) and a rear half RH then the connector 120 would be positioned in the rear half RH and would generally not extend into the front half FH. In typical operation, the connector assembly 1 has the cage assembly 5 disposed around the connector 120 and secured to the circuit board so as to provide an enclosure that provides desirable properties. A heat sink 100 is disposed within the cage assembly 5 and is positioned in an intermediate section 70. As depicted, an optional pair of light pipes 130 can also disposed in the intermediate section 70 and, in operation, the light pipes 130 can provide an indication to the status of the connection between a module (not shown) and the connector 120.

As depicted, the cage assembly 5 includes a body 30, a bottom cover 80 and a rear panel 90 that are constructed to form an enclosure. Upon assembly, the cage assembly 5 includes a front opening (associated with the top port) and a bottom opening. The intermediate section 70 is disposed within the front opening defining an upper port 10 and a lower port 20 as best shown in FIG. 1. The stacked connector is positioned next to the rear panel 90 and is spaced apart from the front opening. Gaskets 40, 50 and 60 are secured around the front opening and the front portion of the intermediate section 70 for providing an electro-magnetic interference (EMI) seal when the connector system 1 is mounted in the rack with the gaskets 40, 50 and 60 engaging a bezel (not shown). As is known, the gaskets 40, 50 and 60 can include resilient spring fingers that extend into the ports and spring fingers that extend away from the ports. As can be appreciated, the spring fingers that extend into the ports are configured to engage the body of the module inserted into the ports and the outwardly extending spring fingers are configured to engage the bezel.

Figure 3:
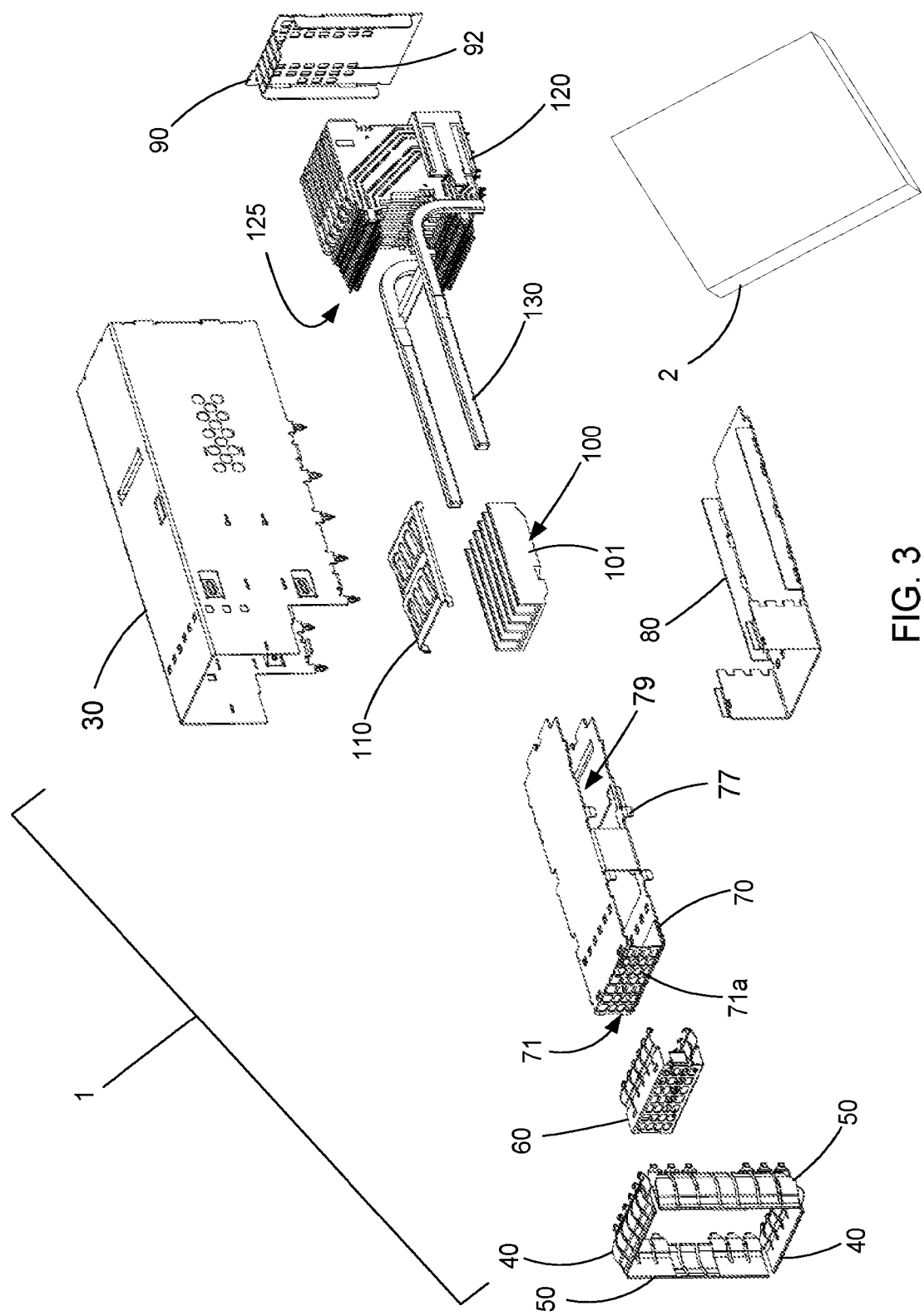
FIG. 3 illustrates a perspective exploded view of the embodiment depicted in FIG. 1.
Figure 4:
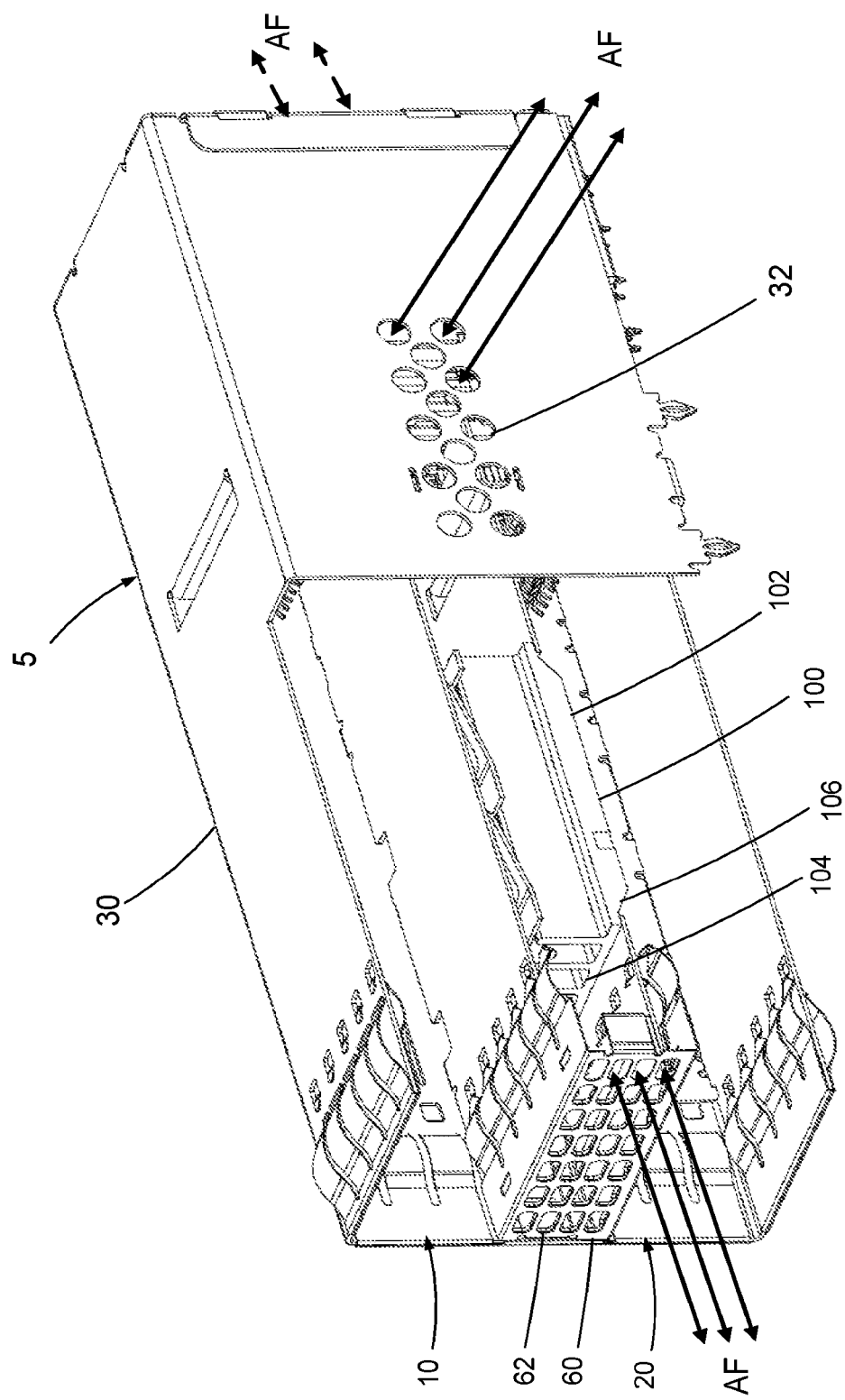
FIG. 4 illustrates a perspective partially cut away view of the embodiment depicted in FIG. 1.

As illustrated in FIGS. 2-4, the intermediate section 70 is disposed in the body 30 and helps define the upper port 10 and the lower port 20. The intermediate section 70 is formed including an upper wall 74 and a lower wall 73 defining an interior space 79 therebetween. As depicted, the intermediate section 70 includes tabs 77 that protrude into slots formed in the body 30 and upon secondary forming, secure the intermediate section 70 to the body 30. Naturally, alternative methods of fastening the intermediate section 70 to the body, such as adhesive or welding or other know techniques, would also be suitable. The intermediate section 70 further includes a front portion 71 having a plurality of apertures 71a formed therein, wherein the apertures can be sized to provide appropriate EMI protection.

Figure 7:
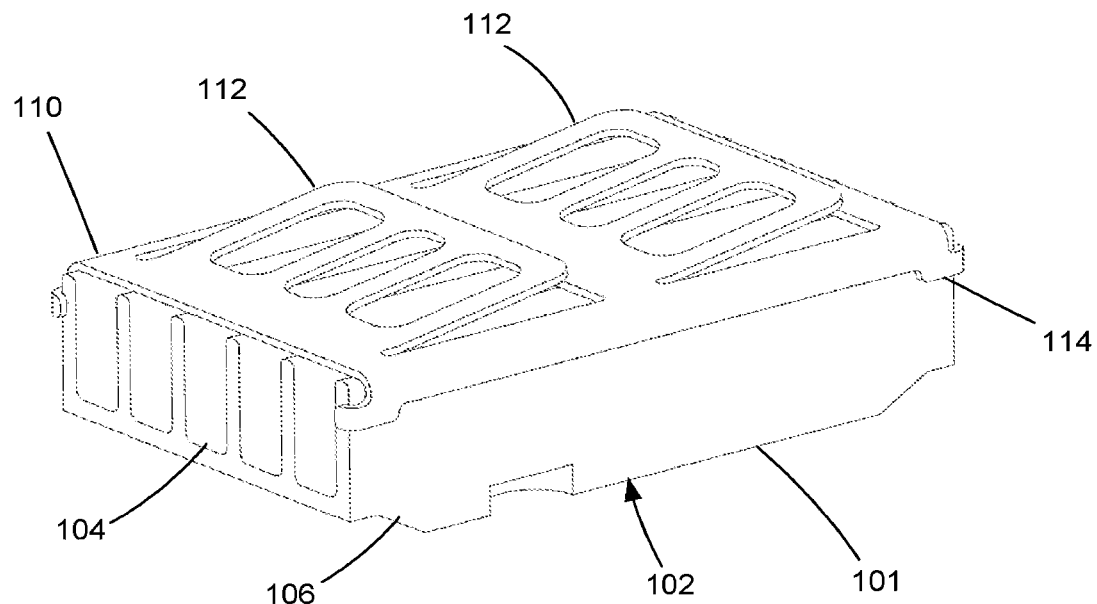
FIG. 7 illustrates a perspective view of an embodiment of a heat sink in combination with a mounting bracket that supports a biasing element.
Figure 8:
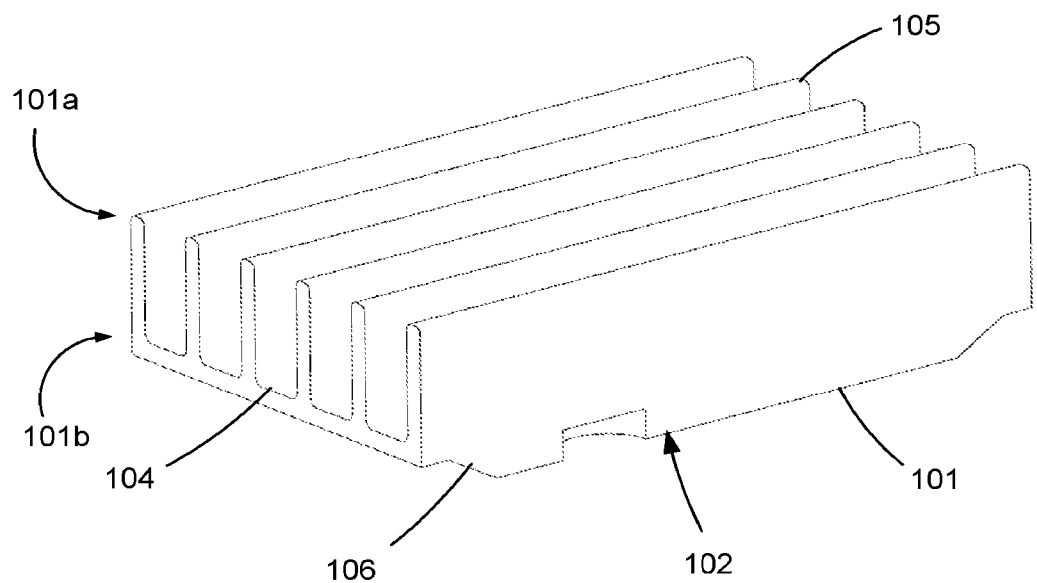
FIG. 8 illustrates a perspective view of the embodiment depicted in FIG. 7 with the mounting bracket removed.

As illustrated in FIGS. 7-8 a heat sink 100 is formed from a thermally conductive material and is positioned in the interior space 79 of the intermediate section 70. The heat sink 100 has a body 101 that includes an upper portion 101a having a plurality of fins 105 formed therein with corresponding channels 104 defined between the fins 105 and a lower portion 101b. The lower portion 101b of the heat sink 100 includes a flat surface 102 positioned below the fins 105. The flat surface 102 includes a tapered edge 106 at both the front portion adjacent the opening of the connector and the rear end positioned near the connector 120. As depicted, a mounting bracket 110 is disposed on the heat sink 100 and abuts the fins 105.

Figure 5:
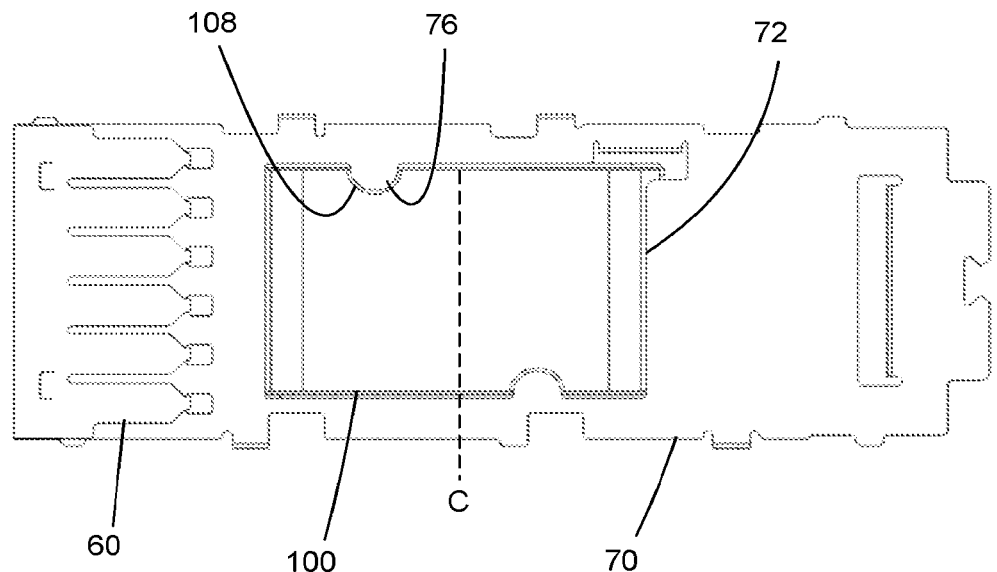
FIG. 5 illustrates an elevated plan view of an embodiment of an intermediate section.
Figure 6:
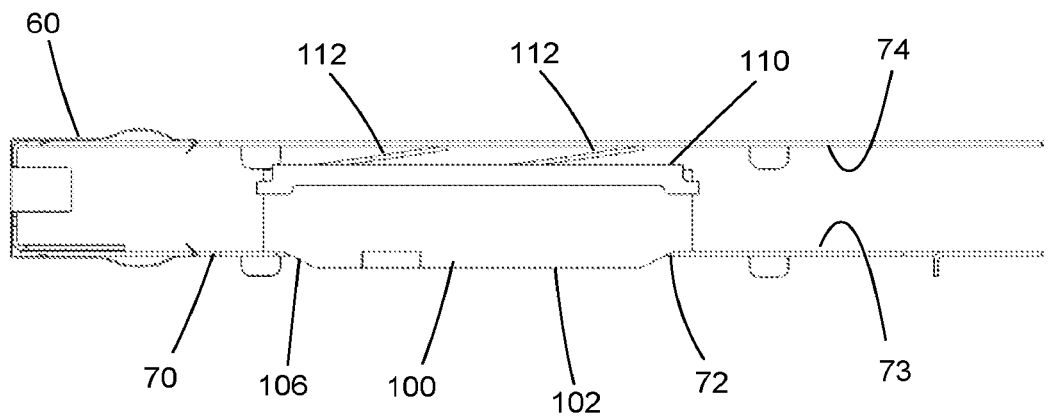
FIG. 6 illustrates an elevated side view of the embodiment depicted in FIG. 5.

In a preferred embodiment a biasing element will urge the heat sink 100 into the lower port 20. As depicted, the mounting bracket 110 includes retaining clips 114 that align the mounting bracket 110 to the heat sink 100. Biasing elements 112 are formed in the mounting bracket 110 and extend away from the heat sink 100. Both the mounting bracket and the heat sink are inserted into the interior space 79 formed in the intermediate section 70. As illustrated in FIGS. 5-6, the heat sink 100 and mounting bracket 110 are disposed between the upper wall 74 and the lower wall 73 with the flat surface 102 of the heat sink 100 extending through a hole 72 formed in the lower wall 73 of the intermediate section 70. In this configuration, the biasing elements 112 engage the upper wall 74 and force the heat sink 100 against the lower wall 73. A locating tab 76 is formed in the lower wall 73 of the intermediate section 70 and is extends into the hole 72. A notch 108 is formed in the heat sink 100 and corresponds to the locating tab 76. As depicted, a second locating tab 76 is formed on the opposing side of the hole 72 and is matched with a similar recess 108 formed in the heat sink 100. The tab 76 and recess 108 can be offset across a centerline C of the heat sink 100 so as to help ensure the heat sink 100 is retained in a symmetrical fashion, it being determined that such symmetry can help allow the heat sink to translate most consistently when, in operation, a module is inserted into the lower port.

While a biasing element is beneficial as it helps compensate for positional variance and other tolerances, in an alternative embodiment the heat sink can be positioned such that it is already correctly aligned with appropriate tolerance control so that no biasing element is needed. In another alternative embodiment, a biasing element could be provided on the floor of the lower port 20. In yet another embodiment, the heat sink could include a thermally conductive and compressible material that is used to take up positional tolerance. Naturally, these various methods of adjusting for tolerance could also be combined (or omitted) as desired. Thus, unless otherwise noted, a particular way of addressing tolerances is not required.

As can be appreciated by referring to FIGS. 4 and 5, the cage assembly is positioned over a connector 120 which is mounted on the corresponding substrate (which may be a printed circuit board). The opening formed in the bottom of the cage 5 allows the connector 120 to be disposed in the interior of the cage assembly 5 while still mating to a supporting circuit board. As best illustrated in FIG. 4 the upper port 10 and lower port 20 are created in the opening defined in part by the intermediate section 70. As can be appreciated from FIG. 3, the flat surface 102 extends through the lower wall 73 and extends into the port 20. The apertures 32 formed in the side of the cage body 30 allow air AF to flow in and out of the cage assembly 5. Additional apertures 71a, 62 formed in the front portion of the intermediate section 70 and the intermediate gasket 60, respectively, allow air flow AF to pass in and out of this section of the cage assembly 5. As depicted in FIG. 2, the rear panel 90 may include apertures 92 which allows optional air flow AF to enter or leave through the rear panel 90 so as to provide additional paths for thermal energy removal. In embodiments where the connector configuration is ganged and stacked it is expected that air flow AF through the rear panel 90 will be more important. It should be noted that in an embodiment the arrangement of the apertures in the side and rear of the cage can be positioned so that a majority of the apertures are positioned in the rear half RH of the cage assembly as this can help improve airflow over the heat sink. In a preferred embodiment a majority of the apertures are positioned rearward of the heat sink, e.g., between the rear face 7 and the heat sink 100.

Figure 11:
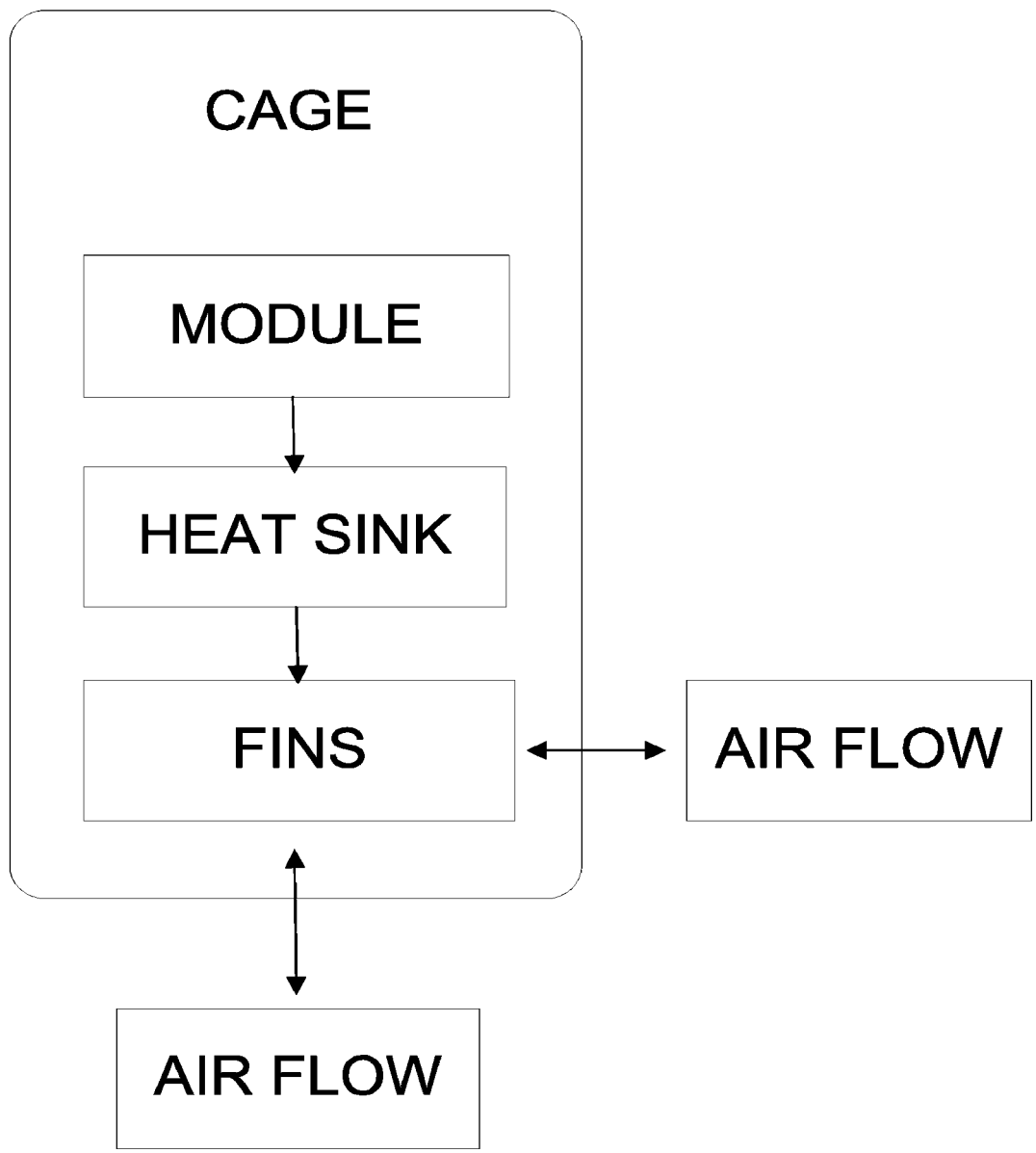
FIG. 11 illustrates a schematic representation of operation of an embodiment such as is depicted in FIG. 1.

The depicted heat sink 100 has certain similarities to heat sinks that are typically known as a riding heat sink. In operation, a module (not shown) is inserted into the lower port 20 and mated with the connector 120. In operation, a top surface of the module abuts the tapered edge 106 and causes the heat sink 100 to displace/translate upward, deflecting the biasing elements 112 and the biasing elements 112 providing a downward reaction force on the heat sink 100 that helps maintaining constant contact between the top of the module and the heat sink 100. This allows for improved thermal connection between the heat sink 100 and the inserted module so that thermal energy to be conducted away from the inserted module into the heat sink and then into the fins. Air flows AF through the cage and through the channels so as to flow past the fins. This air flow, given the temperature differential, helps remove thermal energy from the fins and helps allow the heat energy generated by the module to be dissipated from the connector assembly. As shown in FIG. 11 a schematic of the thermal flow is depicted. In operation, when a module is inserted into a cage, thermal energy generated by the module is transferred to a heat sink, substantially by conductive heat transfer. This thermal energy is then transferred away from the heat sink primarily by convective heat transfer to a fluid, which typically is air, passing over the heat sink. As can be appreciated, the direction of air flow is not critical to the efficiency of the system and thus air can flow into or out of the front face of the connector system. As can be appreciated, however, air flow comes into the connector system along one face and then exits from a different face.

It should be noted that while it is preferable to attach the biasing element 112 directly to the heat sink (as depicted) as it aids in assembly and provides certain manufacturing benefits, such a construction is not required. For example, in an alternative embodiment the biasing element can be mounted directly on the intermediate section 70. Thus any desirable biasing element configuration could be used and the configuration of the biasing element is not intended to be limiting unless otherwise noted.

If not otherwise prevented, upon insertion of a the module into the bottom port the front of the heat sink 100 would be engaged first and this could cause the front portion of the heat sink 100 to begin to be displaced while the rear portion of the heat sink was still in the original position, fully pressed against the lower wall 73. In such an occurrence the heat sink 100 could become wedged and not move smoothly, potentially causing a significant and undesirable increase in insertion force. To help ensure insertion forces are properly managed, the tabs 76 and recesses 108 previously described provide an aligning feature that will keep the heat sink 100 from canting and therefore reduce the chance of it becoming wedged. Additionally, the tabs 76 and recesses 108 can help keep the heat sink in position and can help limit its movement forward or backward within the intermediate section 70 of the cage assembly 5.

Figure 9:
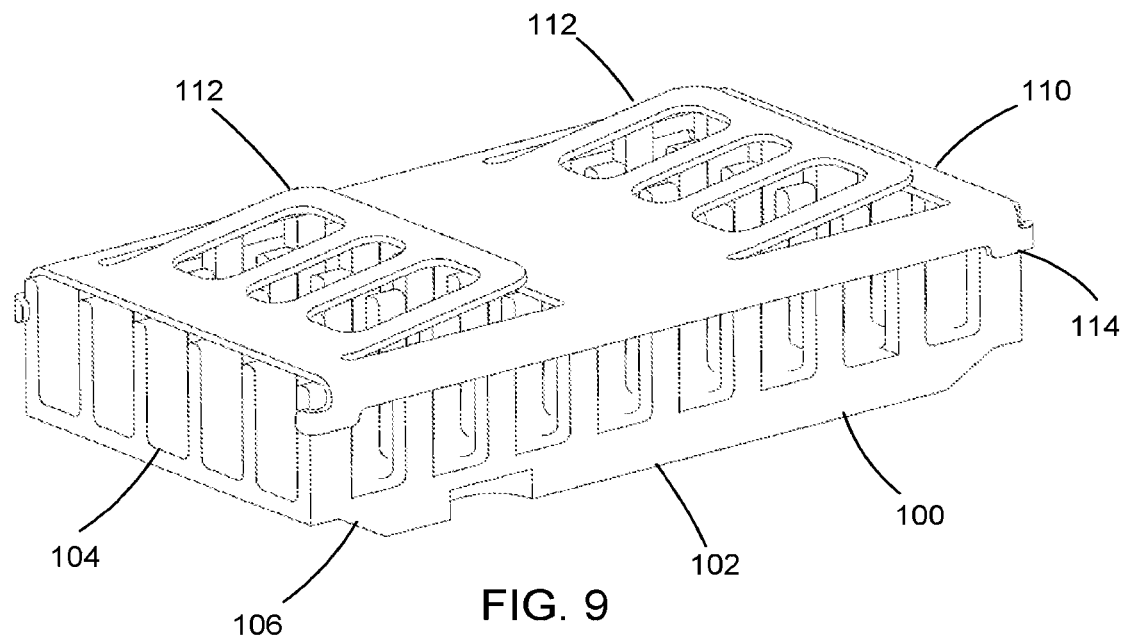
FIG. 9 illustrates a perspective view of another embodiment of a heat sink in combination with a mounting bracket that supports a biasing element.
Figure 10:
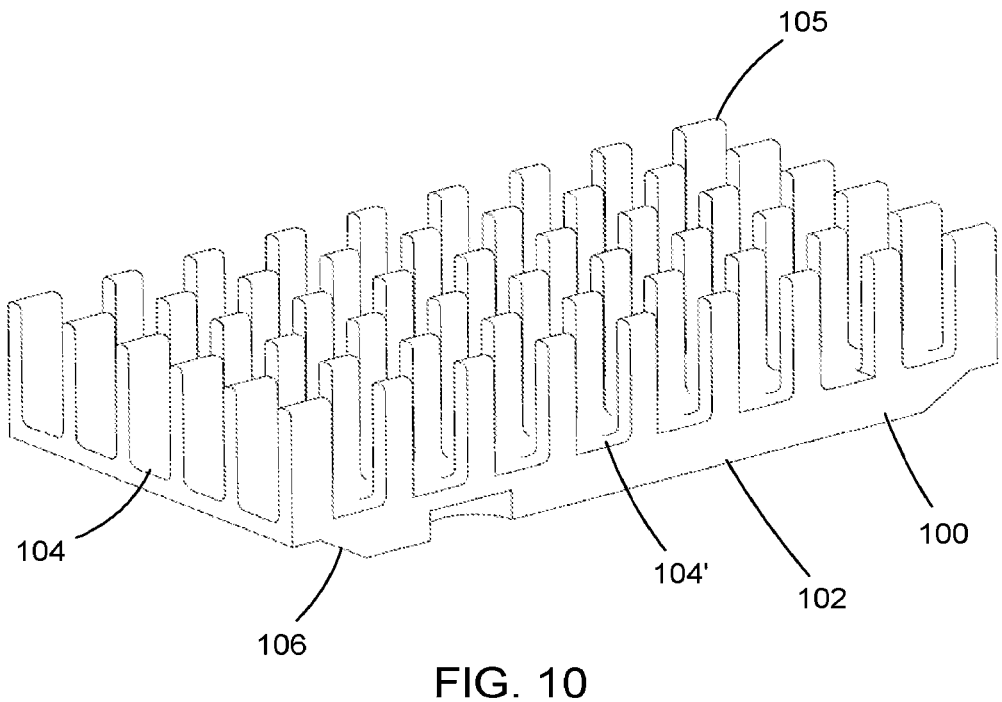
FIG. 10 illustrates a perspective view of the embodiment depicted in FIG. 9 with the mounting bracket removed.

In an embodiment the heat sink 100 may include an array of fins 105 with intersecting channels 104 creating a pillar type arrangement, such as is depicted in FIGS. 9 and 10. In this configuration, air flow AF is not restricted to a single direction pathway, but can be multi-directional and flow around the pillars and find the flow path of least resistance minimizing the possibility of stagnation, as well as increasing turbulence and improving performance. This arrangement also helps provide increased surface area of the fins/pillars that can be exposed to the air, which tends to further improve the ability of the system to cool an inserted module.

While various embodiments are contemplated, it should be noted that the depicted configuration of the thermal pathway between the module and the environment is such that the air flow enters and exists the cage through apertures and flows through channels dissipating the heat energy transferred to the fins of the heat sink. The air flow thorough the cage can be forced by a fan defining an intake and an exhaust.

The disclosure provided herein describes features in terms of preferred and exemplary embodiments thereof. Numerous other embodiments, modifications and variations within the scope and spirit of the claims and the disclosure will occur to persons of ordinary skill in the art.

I claim:

1. A connector system, comprising:
   a cage with a front face, a rear face and two opposing sides that extend between the front and rear face, the cage including an intermediate section that includes an upper wall and a lower wall, the upper and lower walls helping to define an upper port and a lower port in the cage, the lower wall including a hole formed therein so that the intermediate section is in communication with the lower port;
   a connector positioned in the cage, the connector including a first row of cantilevered contacts in the upper port and a second row of cantilevered contacts in the lower port; and
   a biased heat sink disposed in the intermediate section between the upper and lower ports, the biased heat sink extending through the hole into the lower port, wherein the biased heat sink includes a plurality of fins.

2. The connector system of claim 1, wherein a mounting bracket is attached to the heat sink and is configured to engage the upper wall in urging the heat sink against the lower wall.

3. The connector system of claim 2, wherein the mounting bracket includes a biasing element that urges the heat sink into the lower port.

4. The connector system of claim 1, wherein the biased heat sink includes a flat surface that is urged into the lower port.

5. The connector system of claim 1, wherein the plurality of fins is arranged in a plurality of pillars.

6. The connector system of claim 1, wherein the intermediate section includes a front portion with a plurality of apertures provided in the front portion.

7. The connector system of claim 1, wherein the cage has a front half and a rear half and the connector is positioned in the rear half and does not extend into the front half.

8. The connector system of claim 7, wherein a plurality of apertures are provided on at least one of the sides and rear face of the cage and a majority of the plurality of apertures are positioned in the rear half.

9. The connector system of claim 8, wherein the majority of the apertures are positioned between the heat sink and the rear face.

10. A connector system, comprising:
a cage with a front face, a rear face and two opposing sides that extend between the front and rear face, the two opposing sides helping to define an upper port and a lower port,
an intermediate section positioned in the cage, the intermediate section including an upper wall and a lower wall that help define an interior space, the lower wall defining a top of the lower port, the lower wall including a hole formed therein so that the interior space is in communication with the lower port;
a connector positioned in the cage, the connector including a first row of cantilevered contacts positioned in the upper port and a second row of cantilevered contacts positioned in the lower port; and
a heat sink positioned in the interior space, the heat sink extending through the hole into the lower port, wherein the heat sink includes a plurality of fins.

11. The connector system of claim 10, wherein a biasing element urges the heat sink into the lower port.

12. The connector system of claim 10, wherein a biasing element is disposed on the heat sink and is configured to engage the upper wall in urging the heat sink against the lower wall.

13. The connector system of claim 10, wherein apertures provided on a front portion of the intermediate section are in communication with apertures provided on a rear face of the cage.

14. The connector system of claim 10, wherein at least some of the plurality of fins take the form of pillars.

15. The connector system of claim 10, wherein the cage includes apertures on two sides such that, in operation, air can flow in the apertures on one of the two sides, past the fins and out the apertures on the other of the two sides.

* * * * *